United States Patent
Ye

(10) Patent No.: US 9,340,729 B2
(45) Date of Patent: May 17, 2016

(54) HIGH-EFFICIENCY AND HIGH-QUALITY ACIDIC CUPRIC CHLORIDE ETCHANT FOR PRINTED CIRCUIT BOARD

(71) Applicant: Tao Ye, Guangzhou (CN)

(72) Inventor: Tao Ye, Guangzhou (CN)

( * ) Notice: Subject to any disclaimer, the term of this patent is extended or adjusted under 35 U.S.C. 154(b) by 0 days.

(21) Appl. No.: 14/720,988

(22) Filed: May 26, 2015

(65) Prior Publication Data

US 2015/0361342 A1    Dec. 17, 2015

(30) Foreign Application Priority Data

Jun. 13, 2014   (CN) .......................... 2014 1 0266814
Mar. 17, 2015   (CN) .......................... 2015 1 0117884

(51) Int. Cl.
*C09K 13/00* (2006.01)
*C09K 13/04* (2006.01)
*H05K 3/00* (2006.01)

(52) U.S. Cl.
CPC ................ *C09K 13/04* (2013.01); *H05K 3/002* (2013.01)

(58) Field of Classification Search
CPC ................................ C09K 13/04; H05K 3/002
USPC ................................................ 252/79.1, 79.2
See application file for complete search history.

(56) References Cited

U.S. PATENT DOCUMENTS

2005/0016961 A1 *  1/2005  Toda ........................ C23F 1/18
                                                        216/83

* cited by examiner

*Primary Examiner* — Roberts Culbert
(74) *Attorney, Agent, or Firm* — George G. Wang; Bei & Ocean

(57) ABSTRACT

A high-efficiency and high-quality acidic cupric chloride etchant for printed circuit board, which contains cupric chloride, a sub-etchant and an oxidant, where the sub-etchant includes (in percentage by weight) 1%-36.5% of Hcl; 0.01%-45% of one or more compounds selected from $FeCl_3$, $FeCl_2$, Fe, FeO and $Fe_2O_3$. The etchant is used in connection with an automatic detection and charging control during the etching process to ensure the concentration of copper ions, the concentration of dissociated hydrogen ions and the oxidation-reduction potential in the solution arriving at set numerical values.

20 Claims, No Drawings

HIGH-EFFICIENCY AND HIGH-QUALITY ACIDIC CUPRIC CHLORIDE ETCHANT FOR PRINTED CIRCUIT BOARD

FIELD OF THE INVENTION

The invention relates to an etchant for printed circuit board and particularly relates to a high-efficiency and high-quality acidic cupric chloride etchant used in the production of printed circuit board.

BACKGROUND OF THE INVENTION

The etching process of a printed circuit board (PCB) is as follows: applying an etchant on a pre-developed copper-clad laminate and etching away the unprotected, non-conductor part of the printed circuit board, in order to form a circuit. The etching of the non-conductor part utilises redox reaction between the etchant and copper. Said developed copper-clad laminate is made in the previous process and has a pattern.

In the early period, ferric chloride etchant was used in the printed circuit board industry. This etchant uses ferric chloride ($FeCl_3$) as a copper etching agent. The etching rate of $FeCl_3$ is fast and the cost is relatively low. However, as the etchant does not contain any artificially added oxidant which can oxidise $FeCl_2$, ferric chloride is reduced to ferrous chloride ($FeCl_2$) without further regeneration of the ferric chloride. Ferrous chloride is not capable of etching copper in the copper etching process. The concentration of ferric chloride in the etchant is not constant, therefore the etching rate is unstable, and it is difficult to ensure etching quality. Thus, this etchant is seldom applied at present.

At present, the etchant which is widely used in the industry is an acidic cupric chloride etchant. In comparison with the ferric chloride etchant, this etchant has constant etching rate, is easy to control, has relatively high etching quality, and its cost is relatively low.

In the prior art, the acidic cupric chloride etchant employs cupric chloride ($CuCl_2$) as the copper etching agent to etch the copper foil on a printed circuit board. The $Cu^{2+}$ of cupric chloride can oxidise metal copper on the surface of the printed circuit board to $Cu^+$:

$$Cu+CuCl_2 \rightarrow Cu_2Cl_2$$

The cuprous chloride ($Cu_2Cl_2$) generated is insoluble in water, and is adhered to the surface of the copper and can be advantageously used as a banking agent to reduce the level of etch undercut of the circuit. However, when the precipitation is excessive, the etching rate will be seriously affected.

Thus, generally, there is still a need to incorporate an acidic oxidising system, such as hydrochloric acid+sodium chlorate ($NaClO_3$) or hydrochloric acid+hydrogen peroxide ($H_2O_2$) into the cupric chloride etchant to constitute a recycling system, in order to regenerate cupric chloride.

The general regeneration reaction of cupric chloride is $Cu_2Cl_2+2HCl+[O] \rightarrow 2CuCl_2+H_2O$.

The regeneration reaction of cupric chloride using sodium chlorate is $3Cu_2Cl_2+6HCl+NaClO_3 \rightarrow 6CuCl_2+NaCl+3H_2O$.

The regeneration reaction of cupric chloride using hydrogen peroxide is $Cu_2Cl_2+2HCl+H_2O_2 \rightarrow 2CuCl_2+2H_2O$.

Generally, a salt capable of providing chloride ions (such as NaCl or $NH_4Cl$) can also be added to act as an etchant additive to accelerate the regeneration of cupric chloride.

As the components in the etchant changes continuously during the etching process, an automatic detection and charging control machine is generally required in industrial production to detect a variety of parameters of the etchant, such as oxidation-reduction potential (ORP), specific density, concentration of dissociated hydrogen ions and the like, and control the charging amount of each component of the etchant in a real-time manner, in order to achieve automatic continuous regeneration of the acidic cupric chloride etchant and thus maintaining a stable etching rate of the etchant. Generally, the etchant can be separated into the following components, and each component may be charged according to corresponding specific parameters:

1. cupric chloride;
2. sub-etchant: generally comprising HCl and an optional etchant additive (such as NaCl);
3. oxidant: being $H_2O_2$ or $NaClO_3$ generally; and
4. water.

In the process of preparing the etchant, cupric chloride is firstly added into the sub-etchant to allow the concentration of copper ions in the solution to arrive at a prescribed value which is set according to production requirements.

The mass of added cupric chloride is calculated according to formula 1:

$$\frac{\text{molar mass of } CuCl_2}{\text{molar mass of copper ion}} = \frac{\text{mass of } CuCl_2 \text{ to be added per liter of sub-etchant}}{\text{mass of copper ion to be added per liter of sub-etchant}} = \frac{\text{mass of pre-added } CuCl_2}{\text{mass of copper ions corresponding to } CuCl_2 \text{ added}} \quad \text{(Formula 1)}$$

wherein the molar mass of cupric chloride is 134.5 g/mol, the molar mass of copper ion is 63.5 g/mol, and the mass of copper ion to be added into per litre of sub-etchant is the prescribed concentration of copper ions in the etchant (unit: g/L).

Assuming that the prescribed mass of copper ion to be added into per litre of sub-etchant is A g, the mass B of cupric chloride to be added into per litre of sub-etchant, according to formula 1, is (A×134.5÷63.5) g.

After the concentration of copper ions in the sub-etchant arrives at the prescribed value, an automatic detection and charging control machine on a PCB etching production line is used for detecting and controlling the ORP, the concentration of dissociated hydrogen ions and other parameters, such that the sub-etchant and/or the oxidant and/or water can be appropriately supplemented, to allow the concentration of copper ions, the concentration of dissociated hydrogen ions and the ORP of the obtained solution to achieve numerical values preset according to production requirements and obtain the etchant as required for the etching process. A hydrometer on the automatic detection and charging control machine is used for measuring the specific density of the etchant obtained, and a specific density numerical control meter is set according to the specific density value measured by the hydrometer. Alternatively speaking, the numerical value of control points for charging water is set to allow the salt concentration in the etchant to be constant, thereby preventing precipitation in the production process. Afterwards, t he etchant is sprayed onto the surface of the printed circuit board to start the etching operation.

During the etching process, the etchant reacts with copper continuously, and the multiple parameters of the etchant change continuously. In order to achieve a stable etching rate as well as requirements for etching quality, the automatic detection and charging control machine needs to be employed throughout the etching process, to appropriately supplement the sub-etchant, the oxidant and the water in a real-time manner. This keeps the various parameters of the etchant (including the concentration of dissociated hydrogen ions, ORP and specific density) constant at the prescribed values, so that the concentrations of each component in the etchant remain constant. The details thereof are described as follows:

1. Monitoring water supplement: as the etchant reacts with copper on the printed circuit board, the copper content in the etchant is gradually increased, causing the gradual increase of specific density of the etchant. When the specific density exceeds the prescribed value, the automatic detection and charging control machine adds water into the etchant by controlling the corresponding water charging pump, to reduce the specific density of the etchant. The salt concentration of the etchant is thus kept constant, precipitation is prevented and the concentration of copper ions in the etchant is controlled.

2. Monitoring sub-etchant supplement: as HCl is consumed in the regeneration reaction of cupric chloride, the concentration of dissociated hydrogen ions in the etchant is gradually decreased. When the concentration of dissociated hydrogen ions is lower than the prescribed value, the automatic detection and charging control machine adds the sub-etchant into the etchant by controlling the corresponding sub-etchant charging pump, to increase the concentration of dissociated hydrogen ions in the etchant.

3. Monitoring oxidant supplement: as the copper etching agent (i.e. cupric chloride) in the etchant is consumed by reacting with copper on the printed circuit board, the ORP of the etchant is gradually decreased. When the ORP is lower than the set value, the automatic detection and charging control machine adds the oxidant into the etchant by controlling the corresponding oxidant charging pump, to increase the ORP value. The said oxidant participates in the regeneration reaction of the copper etching agent.

As the degree of integration of electronic products increases, the demand for printed circuit boards with fine-line circuits is ever increasing. Generally, "fine-line circuits" refers to circuits with line width and line spacing of below 60 µm, which requires the use of higher etching quality etchants during etching. The etching quality is frequently discussed in terms of "etch factor", which indicates the level of etch undercut. In the etching process, the etchant not only etches downwards, but also etches in the left and right directions. This etching in the left and right directions by the etchant is referred to as "etch undercut". The etch factor (K) is the ratio of etching depth (D) to undercut width at one side (C) (namely K=D/C). When the etching depth D is the same, a larger etch factor indicates a narrower undercut width; as the two side walls of the etched circuit is more vertical, the etching quality is better.

A major factor affecting the undercut width is the amount of banking agent. Banking agent refers to a substance which is adhered to the two side walls of the circuit and can weaken the degree of attack on the two side walls by the etchant. As described above, when the acidic cupric chloride etchant reacts with copper, the cuprous chloride ($Cu_2Cl_2$) generated can be used as a banking agent. When the amount of the banking agent is too small, the level of etch undercut is high and the etch factor is small.

In summary, the regeneration reaction of cupric chloride can be effectively accelerated by increasing the concentration of dissociated hydrogen ions in the etchant, so that the etching rate can be increased. In order to meet large-scale production efficiency, the etching rate needs to be 30 µm/min or higher. An acidic cupric chloride etchant with a relatively high concentration of dissociated hydrogen ions, which can also be referred to as high-acidity cupric chloride etchant, needs to be used. The so-called "high acidity" refers to a "high-acidity system", which is an acidic cupric chloride etchant with concentration of dissociated hydrogen ions [$H^+$] higher than 2.0M. In contrast, an acidic cupric chloride etchant with concentration of dissociated hydrogen ions [$H^+$] of 2.0M or lower is a low-acidity system' etchant. As the etching rates of low-acidity system etchants are too low, they cannot be applied to large-scale production. The acidic cupric chloride etchants currently used in the PCB industry all belong to the high-acidity system. However, the existing high-acidity cupric chloride etchants have the following disadvantages:

1. Irritating acidic odour will be given off at working temperature (about 50° C.), thereby affecting physical health of the production staff and damaging the environment.

2. When the concentration of hydrogen ions is high, a large amount of the $Cu_2Cl_2$ banking agent is converted to $CuCl_2$, thereby causing relatively serious etch undercut; in the case of the high-acidity system, most of the etch factors obtained by etching fine circuits with copper foil thickness of 1 oz, line width and line spacing of 50 µm are less than 3. Serious undercut results in the printed circuit board being prone to short-circuit, which poses potential safety risks to both the workplace and the production staff.

3. In the case of using sodium chlorate as the oxidant for cuprous chloride, when the automatic detection and charging control machine fails, which causes the input of excessive sodium chlorate, chlorine gas will be produced. In mild circumstances, mild chlorine gas poisoning is likely to take place, affecting physical health of the production staff and polluting the environment. In severe circumstances, the large amount of chlorine gas produced may cause moderate to severe chlorine gas poisoning, which lead to casualties.

In the prior art, it is difficult to balance between etching rate and etching quality to meet the etching production requirements of printed circuit boards with fine-line circuits.

SUMMARY OF THE INVENTION

The present invention aims at providing a high-efficiency and high-quality acidic cupric chloride etchant for printed circuit boards. The said acidic cupric chloride etchant, while operating in the high-acidity system, not only maintains the same etching rates as the high-acidity system cupric chloride etchants of prior art, but also improves etching quality; while operating in the low-acidity system, it has a relative high etching rate, which is sufficiently high to meet large-scale production requirements. Additionally, the said acidic cupric chloride etchant could significantly reduce the concentration of dissociated hydrogen ions in the etchant, thereby considerably lowering irritating acidic odour evolved and reducing the amount of chlorine gas produced in the etching process, improving safety of etching production, ensuring the physical health of production staff and reducing impact on the environment.

The purpose of the invention is realized by the following technical proposal:

a high-efficiency and high-quality acidic cupric chloride etchant for printed circuit board, comprising cupric chloride, a sub-etchant and an oxidant, wherein an automatic detection and charging control machine is used for controlling the concentration of dissociated hydrogen ions, oxidation-reduction potential and specific density parameters of the etchant and controlling the charging amount of each component so as to enable the concentration of copper ions, the concentration of dissociated hydrogen ions and the oxidation-reduction potential in the solution to arrive at set numerical values, and the high-efficiency and high-quality acidic cupric chloride etchant for printed circuit board is characterised in that the sub-etchant comprises the following components in percentage by weight:
  1%-36.5% of HCl;
  0.01%-45% of one or more compounds selected from $FeCl_3$, $FeCl_2$, Fe, FeO and $Fe_2O_3$; and
  the balance of water,
the control parameters of a production process using the obtained etchant are set as follows: the concentration of dissociated hydrogen ions is 0.1-5.0M, the oxidation-reduction potential is 380-700 mV and the concentration of copper ions is 1-180 g/L.

The initial charging amount A of cupric chloride is obtained by calculation according to the following formula:

$$A=(134.5/63.5)\times \text{set value of concentration of copper ions}.$$

Preferably, the sub-etchant comprises the following components in percentage by weight:
  4%-36.5% of HCl;
  0.7%-19% of one or more compounds selected from $FeCl_3$, $FeCl_2$, Fe, FeO and $Fe_2O_3$; and the balance of water.

More preferably, the sub-etchant comprises the following components in percentage by weight:
  10%-31% of HCl;
  1%-15% of one or more compounds selected from $FeCl_3$, $FeCl_2$, Fe, FeO and $Fe_2O_3$; and the balance of water.

Preferably, the sub-etchant further comprises 1%-8% by weight of an etchant additive.

Preferably, the etchant additive is NaCl and/or $NH_4Cl$.

In order to facilitate the control of the etching process, the oxidant is selected as $H_2O_2$ with the concentration of 5%-50% or $NaClO_3$ with the concentration of 1%-38%.

Preferably, the concentration of dissociated hydrogen ions is 0.2-4.0M, the oxidation-reduction potential is 470-700 mV and the concentration of copper ions is 60-166 g/L.

Preferably, the concentration of dissociated hydrogen ions is 2-2.5M, the oxidation-reduction potential is 500-650 mV and the concentration of copper ions is 70-149 g/L.

Preferably, the concentration of dissociated hydrogen ions is from 0.2 to less than 2.0M, the oxidation-reduction potential is 500-650 mV and the concentration of copper ions is 70-149 g/L.

The invention points of the invention lie in that one or more compounds selected from the group consisting of $FeCl_3$, $FeCl_2$, Fe, FeO and $Fe_2O_3$ are added into the sub-etchant, wherein $FeCl_3$ being the actual active compound. The reason that compounds other than $FeCl_3$ can also be used is that they can react with hydrochloric acid and/or the oxidant in the etchant to generate $FeCl_3$:

$$Fe+HCl \rightarrow FeCl_2+H_2$$

$$FeO+2HCl \rightarrow FeCl_2+2H_2O$$

$$Fe_2O_3+6HCl \rightarrow 2FeCl_3+3H_2O$$

$$2FeCl_2+[O]+2HCl \rightarrow 2FeCl_3+H_2O$$

As they can respectively react with HCl in the etchant to generate $FeCl_3$, when $FeCl_2$, Fe, FeO and $Fe_2O_3$ are selected individually or in combination, there are no limitations on mixing ratio of the compounds; they can be mixed in any proportion, as long as the final $FeCl_3$ generated in the etchant is within the range of the invention.

The main reasons for adding ferric chloride into the etchant of the invention are as follows:

1. Ferric chloride can oxidise copper, and its oxidising ability is stronger than that of cupric chloride, so that the etching rate can be increased:

$$2FeCl_3+Cu \rightarrow 2FeCl_2+CuCl_2$$

As $H_2O_2$ or $NaClO_3$ is present in the etchant as an oxidant, the $FeCl_2$ generated after etching of copper by ferric chloride can be re-converted to $FeCl_3$ and the etchant can maintain a stable high etching rate:

the general regeneration reaction of ferric chloride is $2FeCl_2+2HCl+[O] \rightarrow 2FeCl_3+H_2O$;

the regeneration reaction of ferric chloride using hydrogen peroxide is $2FeCl_2+2HCl+H_2O_2 \rightarrow 2FeCl_3+2H_2O$;

the regeneration reaction of ferric chloride using sodium chlorate is $6FeCl_2+6HCl+NaClO_3 \rightarrow 6FeCl_3+NaCl+3H_2O$.

3. Ferric chloride is uncommon in that it can not only coexist with the hydrochloric acid component in the etchant, but can also avoid any mutual consumption with the other oxidants in the etchant. The control process is simple, and the production process is safe. According to long-term studies by the inventor, currently, there are no other oxidants which can meet the above conditions and additionally have stronger oxidising ability than that of cupric chloride.

4. The invention can improve the etching rate of etchants operating at the low-acidity system (the concentration of dissociated hydrogen ions [$H^+$] is 2.0M or less) as well: in the low-acidity system, as the amount of hydrochloric acid in the etchant is relatively small, the concentration of chloride ions is relatively low accordingly. This can easily lead to excessive precipitation of cuprous chloride, which affects the etching rate. Ferric chloride can adequately increase the concentration of chloride ions in the etchant, the increased concentration of chloride ions favours the conversion of cuprous chloride to cupric chloride (as the concentration of the reactant is increased, the equilibrium is shifted to the right hand side, which favours the forward reaction). As the amount of cuprous chloride in the etchant is reduced, the relatively high etching rate is maintained.

5. Ferric chloride can be used as an auxiliary oxidant to oxidise cuprous chloride, thereby increasing the regeneration rate of cupric chloride:

$$2FeCl_3+Cu_2Cl_2 \rightarrow 2FeCl_2+2CuCl_2;$$

6. Part of ferric chloride is hydrolyzed to ferric hydroxide colloidal precipitate ($Fe(OH)_3$), which acts as a banking agent during etching, reducing undercut and improving etching quality:

$$FeCl_3+3H_2O \rightarrow Fe(OH)_3+3HCl;$$

7. $FeCl_3$ is easy to obtain, cheap and environmentally friendly.

The present invention can be further improved as follows:

As cupric chloride is expensive, a small amount (1 g/L or more) of cupric chloride can be pre-added, and an appropriate amount of copper is then used instead of cupric chloride to add into the sub-etchant, allowing copper to react with cupric chloride to generate cuprous chloride. The generated cuprous chloride further reacts with the oxidant and hydrochloric acid to produce cupric chloride, thereby supplementing the required concentration of copper ions and saving the amount of cupric chloride used. The mass of copper to be incorporated can be calculated according to formula 1 described above and formula 2 below:

$$\frac{\text{molar mass of copper}}{\text{molar mass of copper ion}} = \frac{\text{mass of copper to be added into per liter of sub-etchant}}{\text{mass of copper ion to be added into per liter of sub-etchant}} \quad \text{(Formula 2)}$$

Wherein the molar mass of copper is equivalent to the molar mass of copper ion, which is 63.5 g/mol. Therefore, the mass of copper to be added into per litre of sub-etchant equals to the mass of copper ion to be added into per litre of sub-etchant.

Assuming that the total mass of copper ions to be added into per litre of sub-etchant is A g. After B' g of cupric chloride is pre-added, the mass of copper ions to be added into per litre of sub-etchant becomes A−(B'×63.5÷134.5) g. It can be deduced from formula 2 that the mass of copper to be added into per litre of sub-etchant is equal to the mass of copper ions to be added into per litre of sub-etchant, so that after B' g of cupric chloride is added into per litre of sub-etchant, A−(B'×63.5÷134.5) g of copper needs to be further added to achieve the set mass of copper ions in per litre of sub-etchant.

A method of applying the high-efficiency and high-quality acidic cupric chloride etchant for printed circuit board of the present invention to an etching process comprises the following steps:

Step 1: At ambient temperature and pressure, according to the designated components and their mixing ratio, selected raw materials are dissolved in water to prepare the sub-etchant; at the mean time, an oxidant solution is prepared.

Step 2: cupric chloride is added into the sub-etchant obtained in step 1, wherein the amount of cupric chloride added is calculated according to formula 1.

Step 3: the solution obtained in step 2 is poured into an etchant tank on a printed circuit board production line, and sensor probes of the automatic detection and charging control machine are immersed into the etchant in order to detect and control various parameters. The said sensor probes are for sensing the ORP, the concentration of dissociated hydrogen ions and the specific density of the etchant.

Step 4: the oxidant solution prepared in step 1 is poured into an oxidant tank. The said oxidant tank is connected to a charging pump controlled by an ORP numerical control meter of the automatic detection and charging control machine; the sub-etchant is poured into a sub-etchant tank, the said sub-etchant tank is connected to a charging pump controlled by a dissociated hydrogen ion concentration numerical control meter of the automatic detection and charging control machine; and a charging pump controlled by a specific density numerical control meter of the automatic detection and charging control machine is connected to a water pipe.

Step 5: the temperature of the etchant tank is set to 45-50° C., the pressure of spray nozzles of the etching production line is set to 2-3 kg/cm² and the concentration of dissociated hydrogen ions and the oxidation-reduction potential are set according to the requirements of the production process; the automatic detection and charging control machine is started and the etchant is prepared; when the concentration of dissociated hydrogen ions and the ORP of the etchant arrive at the set numerical values, the numerical value of the specific density numerical control meter is set according to the reading of a hydrometer on the automatic detection and charging control machine.

Step 6: the etching operation is started. The various control parameters of the production process is detected by the automatic detection and charging control machine during the course of the etching operation. The machine automatically controls the supplementation of various components of the etchant, thereby keeping the concentration of dissociated hydrogen ions, the oxidation-reduction potential and the specific density at set numerical values during the etching process.

Compared with the Prior Art, the Invention has the Following Beneficial Effects:

1. High etching rate: as an auxiliary copper etching reagent, ferric chloride is added into the sub-etchant. At the same hydrogen ion concentration, the etching rate of the etchant of the present invention is higher than that of the etchant in prior art—the etching rate can be twice of the prior art or higher. The requirements of large-scale high-efficiency production can be better met, and the energy consumed producing a single product is greatly reduced.

2. High etching quality: part of ferric chloride in the etchant of the invention can be hydrolyzed to ferric hydroxide colloidal precipitate ($Fe(OH)_3$), which acts as a banking agent, reducing etch undercut and improving etching quality; in the embodiments, etch factors for etching circuits with copper foil thickness of 1 oz, line width and line spacing of 50.8 μm can be above 3.0, so that the requirements for etching printed circuit boards with fine-line circuits are met.

3. Safety and environmental friendliness are significantly improved: the etchant of the present invention can be operated at both high-acidity systems and low-acidity systems. For etchants operating at the low-acidity system (the concentration of dissociated hydrogen ions [$H^+$] being 2.0M or less), the concentration of hydrogen ions in the etchant is relatively low. For the etchant operating at the high-acidity system, the concentration of hydrogen ions required for the etchant of the present invention to reach the same etching rate as that of the prior art is significantly lower. At working temperature (45-50° C.), the lower the concentration of dissociated hydrogen ions in the etchant, the less irritating acidic odour will be evolved; this effect is particularly obvious in the low-acidity system etchants. Therefore, the present invention effectively improves the working environment, promoting health and wellbeing of the production staff and reducing environmental pollution.

4. Production cost is reduced: when the etchant of the present invention is operating in the high-acidity system, the concentration of hydrogen ions required for the etchant to reach the same etching rate as that of the prior art is significantly lower, so that less hydrochloric acid is required, reducing production cost; also, as the etching quality is improved, the scrap rate of the printed circuit board can be effectively decreased, and the production cost can be further reduced.

5. Low-acidity system etchants can also be used in industrial production: the etchant of the invention can still have an etching rate of higher than 30 μm/min when operating in the low acidity system (i.e. the concentration of dissociated hydrogen ions [$H^+$] is 2.0M or less), which meets the requirements of large scale production.

6. The low-acidity system etchants can ensure safety of etching production: more importantly, when the acidic cupric chloride etchant of the present invention is operating at the low-acidity system, as the concentration of chloride ions in the etchant is relatively low, when the automatic detection and charging control machine fails, even if excessive sodium chlorate is put in, only a small amount of chlorine gas will be produced. Treatment of the chlorine gas produced by a waste gas exhausting and neutralizing treatment system on the production line is sufficient to meet the chlorine emission standard, and serious safety accidents relating to chlorine gas poisoning can be effectively avoided.

DETAILED DESCRIPTION OF THE EMBODIMENTS

The invention is further described by the following exemplary embodiments. It should be understood that the description and specific examples are intended for purposes of illustration only and are not intended to limit the scope of the present disclosure. Nonessential modification and adjustments made by other people according to the invention still belong to the protection scope of the invention.

In the following exemplary embodiments and comparative examples, the ferric chloride used is preferably $FeCl_3.6H_2O$ ($\geq$99.0) produced by Guangzhou Chemical Reagent Factory; the ferrous chloride used is preferably $FeCl_2.4H_2O$ produced by Guangzhou Chemical Reagent Factory; the iron used is preferably iron powder produced by Guangzhou Chemical Reagent Factory; the ferrous oxide used is preferably FeO (99.9%) produced by Sigma-Aldrich; the ferric oxide used is preferably $Fe_2O_3$ produced by Guangzhou Chemical Reagent Factory; the sodium chloride used is preferably NaCl ($\geq$99.0) produced by Guangzhou Chemical Reagent Factory; the ammonium chloride used is preferably $NH_4Cl$ produced by Guangzhou Chemical Reagent Factory; the hydrochloric acid used is preferably 36.5% hydrochloric acid solution produced by Guangzhou Chemical Reagent Factory; the copper used is preferably copper powder produced by Guangzhou Chemical Reagent Factory; the cupric chloride used is preferably $CuCl_2.2H_2O$ ($\geq$99.0) produced by Guangzhou Chemical Reagent Factory; the $H_2O_2$ used is preferably 50% $H_2O_2$ produced by Guangzhou Chemical Reagent Factory; and the $NaClO_3$ used is preferably $NaClO_3$ ($\geq$99.0) produced by Guangzhou Chemical Reagent Factory. The automatic detection and charging control machine used is preferably Yegao PCB acidic etching automatic charging control machine type-2 produced by Guangzhou Yegao Chemical Co., Ltd. In addition to the above-listed products, those of skill in the art can also select products with similar properties to those listed herein according to conventional choices to achieve the object of the current invention.

Embodiment 1

Step 1: at ambient temperature and pressure, according to the designated components and their mixing ratio as shown in Table 1 below, selected raw materials are dissolved in water to prepare the sub-etchant; hydrogen peroxide was selected as the oxidant, a 27.5% of $H_2O_2$ solution was prepared;

Step 2: B g of cupric chloride was added into per litre of the sub-etchant obtained in step 1; the added amount of cupric chloride was obtained by calculation according to the set value of the concentration of copper ions in the solution listed in Table 1:

$$\frac{\text{molar mass of } CuCl_2}{\text{molar mass of copper ion}} = \frac{\text{mass of } CuCl_2 \text{ to be added per liter of sub-etchant}}{\text{mass of copper ion to be added per liter of sub-etchant}} =$$ (Formula 1)

$$\frac{\text{mass of pre-added } CuCl_2}{\text{mass of copper ion corresponding to added } CuCl_2}$$

Wherein the molar mass of cupric chloride is 134.5 g/mol; and the molar mass of copper ion is 63.5 g/mol. The mass of copper ion to be added into per litre of sub-etchant is 120 g according to the value specified in embodiment 1 of Table 1. Therefore, the mass B of cupric chloride to be added into per litre of sub-etchant is 134.5×120÷63.5=254.2 g Step 3: the solution obtained in step 2 was poured into an etchant tank, and sensor probes of the automatic detection and charging control machine were immersed into the etchant in order to detect and control various parameters.

Step 4: the oxidant solution (27.5% of $H_2O_2$) was poured into an oxidant tank, which was connected to a charging pump controlled by an ORP numerical control meter of the automatic detection and charging control machine; the sub-etchant was poured into a sub-etchant tank, which was connected to the charging pump controlled by a dissociated hydrogen ion concentration numerical control meter of the automatic detection and charging control machine; and a charging pump controlled by a specific density numerical control meter of the automatic detection and charging control machine was connected to a water pipe.

Step 5: the temperature of the etchant tank was set to 49° C., the pressure of spray nozzles of the etching machine was set as 2 kg/cm$^2$, and the concentration of dissociated hydrogen ions and the oxidation-reduction potential (ORP) were set as the values specified in Table 1 (generally, the specific parameters were decided according to specific processing requirements of a printed circuit board). The automatic detection and charging control machine was started and the etchant was prepared; when the concentration of dissociated hydrogen ions and the ORP in the etchant arrived at the set numerical values, the numerical value of the specific density numerical control meter was set according to the reading of a hydrometer on the automatic detection and charging control machine.

Step 6: the etching operation was started. All the components in the etchant were automatically charged and balanced by the automatic detection and charging control machine, keeping the concentration of dissociated hydrogen ions, the oxidation-reduction potential and the specific density at the numerical values specified in Table 1.

An etch factor test was carried out using printed circuit board with size of 620×540 mm, copper foil thickness of 1 oz, line width and line spacing of 50.8 μm. A pure copper etching rate test board with size of 500×300 mm×1.5 mm was employed for spray corrosion testing. The etching rate and etch factor K were calculated using methods known in the art, e.g., those described in *Printed Circuit Technique* by Li Xueming, Occupational Skill Testing Authority of Electronic Industry of Ministry of Industry and Information Technology, fifth edition, p 387-389; "*Theory and Application of Metal Corrosion*", Wei Baoming, Chemical Industry Press, p 5-7; *Discussion in Methods of Etch Factor Calculation*, Tian Ling, et al., printed circuit information, 2007 No. 12, p 55-56.

Embodiments 2-4

The procedures of embodiment 1 were repeated respectively, using the designated content of each component and parameters of the automatic detection and charging control machine as specified in embodiments 2-4 of Table 1 below. Wherein in step 2, 2 g of cupric chloride was firstly added into per litre of the sub-etchant obtained in step 1, and then copper was added in order to allow the concentration of copper ions in the obtained solution to reach the value specified in embodiments 2-4 of Table 1 (i.e. 120 g/L). According to formula 1 and formula 2 described above, the mass of copper added was 120−(2×63.5÷134.5)=119 g.

In embodiments 1-3, the concentrations of dissociated hydrogen ions, the ORP values, the oxidant $H_2O_2$ solutions and the percentages by weight of etchant additive (namely NaCl and HCl) in the sub-etchant are the same, but the percentages by weight of $FeCl_3$ are different. From the results of Table 2, it can be known that etching rate and etch factor are proportional to ferric chloride content in the etchant. When the content of $FeCl_3$ in the etchant reaches 6% (i.e. embodiment 3), the etching rate is increased by 69%, and the etch factor is increased by 70% in comparison with comparative example 1; the etching rate is increased by 51% and the etch factor is increased by 95% in comparison with comparative example 2.

In embodiment 3 and embodiment 4, the concentrations of dissociated hydrogen ions, the ORP values, the concentrations of copper ions, the oxidant $H_2O_2$ solutions and the percentages by weight of $FeCl_3$ and HCl in the sub-etchant are identical. The sub-etchant contains 5% by weight of NaCl in embodiment 3 and no NaCl in embodiment 4. From the results of table 2, we can see that the etching rate of the etchant in embodiment 3 is increased by 16% in comparison with that of the etchant in embodiment 4, and the etch factors in embodiment 3 and 4 is much the same. This shows that the presence of NaCl accelerates the etching rate.

Embodiment 5

The procedures of embodiment 1 were repeated respectively, using the designated content of each component and parameters of the automatic detection and charging control machine as specified in embodiment 5 of Table 1 below. Wherein in step 1, hydrogen peroxide was used as the oxidant, and was prepared into a solution of 50% $H_2O_2$; and in step 2, 254.2 g of cupric chloride was added into per litre of the sub-etchant obtained in step 1 to allow the concentration of copper ions in the obtained solution to reach the value specified in embodiment 5 of Table 1.

Embodiment 6

The procedures of embodiment 1 were repeated respectively, using the designated content of each component and parameters of the automatic detection and charging control machine as specified in embodiment 6 of Table 1 below. Wherein in step 1, sodium chlorate was used as the oxidant, and was prepared into a solution of 30% $NaClO_3$; and in step 2, 254.2 g of cupric chloride was added into per litre of the sub-etchant obtained in step 1 to allow the concentration of copper ions in the obtained solution to reach the value specified in embodiment 6 of Table 1.

Embodiment 7

The procedures of embodiment 1 were repeated respectively, using the designated content of each component and parameters of the automatic detection and charging control machine as specified in embodiment 7 of Table 1 below. Wherein in step 1, sodium chlorate was used as the oxidant, and was prepared into a solution of 35% $NaClO_3$; and in step 2, 205.5 g of cupric chloride was added into per litre of the sub-etchant obtained in step 1 to allow the concentration of copper ions in the obtained solution to reach the value specified in embodiment 7 of Table 1.

Embodiments 8-10

The procedures of embodiment 1 were repeated respectively, using the designated content of each component and parameters of the automatic detection and charging control machine as specified in embodiments 8-10 of Table 1 below. Wherein in step 1, sodium chlorate was used as the oxidant, and was prepared into a solution of 28% $NaClO_3$; and in step 2, 203.3 g of cupric chloride was added into per litre of the sub-etchant obtained in step 1 to allow the concentration of copper ions in the obtained solution to reach the value specified in embodiments 8-10 of Table 1.

In embodiments 8-10, the percentages by weight of $FeCl_3$, the concentrations of copper ions, the ORP values, the oxidant used and the percentages by weight of NaCl and HCl in the sub-etchant are the same, but the concentrations of dissociated hydrogen ions are different. It is shown from the results of Table 2 that as the concentration of dissociated hydrogen ions increases, the etching rate increases, while the etch factor decreases.

Embodiments 11-12

The procedures of embodiment 1 were repeated respectively, using the designated content of each component and parameters of the automatic detection and charging control machine as specified in embodiments 11-12 of Table 1 below. Wherein in step 1, sodium chlorate was used as the oxidant, and was prepared into a solution of 20% $NaClO_3$; and in step 2, 180.0 g of cupric chloride was added into per litre of the sub-etchant obtained in step 1 to allow the concentration of copper ions in the obtained solution to reach the value specified in embodiments 11-12 of Table 1.

Embodiment 13

The procedures of embodiment 1 were repeated respectively, using the designated content of each component and parameters of the automatic detection and charging control machine as specified in embodiment 13 of Table 1 below. Wherein in step 1, sodium chlorate was used as the oxidant, and was prepared into a solution of 30% $NaClO_3$; and in step 2, 243.6 g of cupric chloride was added into per litre of the sub-etchant obtained in step 1 to allow the concentration of copper ions in the obtained solution to reach the value specified in embodiment 13 of Table 1.

Embodiment 14

The procedures of embodiment 1 were repeated respectively, using the designated content of each component and parameters of the automatic detection and charging control machine as specified in embodiment 14 of Table 1 below. Wherein in step 1, sodium chlorate was used as the oxidant, and was prepared into a solution of 15% $NaClO_3$; and in step 2, 133.4 g of cupric chloride was added into per litre of the sub-etchant obtained in step 1 to allow the concentration of copper ions in the obtained solution to reach the value specified in embodiment 14 of Table 1.

Embodiments 15-18

The procedures of embodiment 1 were repeated respectively, using the designated content of each component and parameters of the automatic detection and charging control machine as specified in embodiments 15-18 of Table 1 below. Wherein in step 1, sodium chlorate was used as the oxidant, and was prepared into a solution of 30% $NaClO_3$; and in step 2, 31.8 g of cupric chloride was added into per litre of the sub-etchant obtained in step 1 to allow the concentration of copper ions in the obtained solution to reach the value specified in embodiments 15-18 of Table 1.

Embodiment 19

The procedures of embodiment 1 were repeated respectively, using the designated content of each component and parameters of the automatic detection and charging control machine as specified in embodiment 19 of Table 1 below. Wherein in step 1, sodium chlorate was used as the oxidant, and was prepared into a solution of 30% $NaClO_3$; and in step 2, 2.12 g of cupric chloride was added into per litre of the sub-etchant obtained in step 1 to allow the concentration of copper ions in the obtained solution to reach the value specified in embodiment 19 of Table 1.

Embodiment 20

The procedures of embodiment 1 were repeated respectively, using the designated content of each component and parameters of the automatic detection and charging control machine as specified in embodiment 20 of Table 1 below. Wherein in step 1, sodium chlorate was used as the oxidant, and was prepared into a solution of 30% $NaClO_3$; and in step 2, 133.4 g of cupric chloride was added into per litre of the sub-etchant obtained in step 1 to allow the concentration of copper ions in the obtained solution to reach the value specified in embodiment 20 of Table 1.

Embodiments 21-22

The procedures of embodiment 1 were repeated respectively, using the designated content of each component and parameters of the automatic detection and charging control machine as specified in embodiments 21-22 of Table 1 below. Wherein in step 1, sodium chlorate was used as the oxidant, and was prepared into a solution of 30% $NaClO_3$; and in step 2, 243.6 g of cupric chloride was added into per litre of the sub-etchant obtained in step 1 to allow the concentration of copper ions in the obtained solution to reach the value specified in embodiments 21-22 of Table 1.

Embodiment 23

The procedures of embodiment 1 were repeated respectively, using the designated content of each component and parameters of the automatic detection and charging control machine as specified in embodiment 23 of Table 1 below. Wherein in step 1, sodium chlorate was used as the oxidant, and was prepared into a solution of 38% $NaClO_3$; and in step 2, 194.9 g of cupric chloride was added into per litre of the sub-etchant obtained in step 1 to allow the concentration of copper ions in the obtained solution to reach the value specified in embodiment 23 of Table 1.

Embodiment 24

The procedures of embodiment 1 were repeated respectively, using the designated content of each component and parameters of the automatic detection and charging control machine as specified in embodiment 24 of Table 1 below. Wherein in step 1, sodium chlorate was used as the oxidant, and was prepared into a solution of 30% $NaClO_3$; and in step 2, 63.5 g of cupric chloride was added into per litre of the sub-etchant obtained in step 1 to allow the concentration of copper ions in the obtained solution to reach the value specified in embodiment 24 of Table 1.

Embodiment 25

The procedures of embodiment 1 were repeated respectively, using the designated content of each component and parameters of the automatic detection and charging control machine as specified in embodiment 25 of Table 1 below. Wherein in step 1, sodium chlorate was used as the oxidant, and was prepared into a solution of 30% $NaClO_3$; and in step 2, 127.1 g of cupric chloride was added into per litre of the sub-etchant obtained in step 1 to allow the concentration of copper ions in the obtained solution to reach the value specified in embodiment 25 of Table 1.

Embodiment 26

The procedures of embodiment 1 were repeated respectively, using the designated content of each component and parameters of the automatic detection and charging control machine as specified in embodiment 26 of Table 1 below. Wherein in step 1, sodium chlorate was used as the oxidant, and was prepared into a solution of 22% $NaClO_3$; and in step 2, 173.7 g of cupric chloride was added into per litre of the sub-etchant obtained in step 1 to allow the concentration of copper ions in the obtained solution to reach the value specified in embodiment 26 of Table 1.

Embodiment 27

The procedures of embodiment 1 were repeated respectively, using the designated content of each component and parameters of the automatic detection and charging control machine as specified in embodiment 27 of Table 1 below. Wherein in step 1, sodium chlorate was used as the oxidant, and was prepared into a solution of 30% $NaClO_3$; and in step 2, 148.3 g of cupric chloride was added into per litre of the sub-etchant obtained in step 1 to allow the concentration of copper ions in the obtained solution to reach the value specified in embodiment 27 of Table 1.

Embodiment 28

The procedures of embodiment 1 were repeated respectively, using the designated content of each component and parameters of the automatic detection and charging control machine as specified in embodiment 28 of Table 1 below. Wherein in step 1, sodium chlorate was used as the oxidant, and was prepared into a solution of 30% $NaClO_3$; and in step 2, 315.6 g of cupric chloride was added into per litre of the sub-etchant obtained in step 1 to allow the concentration of copper ions in the obtained solution to reach the value specified in embodiment 28 of Table 1.

Embodiment 29

The procedures of embodiment 1 were repeated respectively, using the designated content of each component and parameters of the automatic detection and charging control machine as specified in embodiment 29 of Table 1 below. Wherein in step 1, sodium chlorate was used as the oxidant, and was prepared into a solution of 30% $NaClO_3$; and in step 2, 351.6 g of cupric chloride was added into per litre of the sub-etchant obtained in step 1 to allow the concentration of copper ions in the obtained solution to reach the value specified in embodiment 29 of Table 1.

Embodiment 30

The procedures of embodiment 1 were repeated respectively, using the designated content of each component and parameters of the automatic detection and charging control machine as specified in embodiment 30 of Table 1 below. Wherein in step 1, sodium chlorate was used as the oxidant, and was prepared into a solution of 30% $NaClO_3$; and in step 2, 381.3 g of cupric chloride was added into per litre of the sub-etchant obtained in step 1 to allow the concentration of copper ions in the obtained solution to reach the value specified in embodiment 30 of Table 1.

Embodiments 31-37

The procedures of embodiment 1 were repeated respectively, using the designated content of each component and parameters of the automatic detection and charging control machine as specified in embodiments 31-37 of Table 1 below. Wherein in step 1, sodium chlorate was used as the oxidant, and was prepared into a solution of 25% $NaClO_3$; and in step 2, 211.8 g of cupric chloride was added into per litre of the sub-etchant obtained in step 1 to allow the concentration of copper ions in the obtained solution to reach the value specified in embodiments 31-37 of Table 1.

Embodiments 38-39

The procedures of embodiment 1 were repeated respectively, using the designated content of each component and parameters of the automatic detection and charging control machine as specified in embodiments 38-39 of Table 1 below. Wherein in step 1, sodium chlorate was used as the oxidant, and was prepared into a solution of 30% $NaClO_3$; and in step 2, 275.4 g of cupric chloride was added into per litre of the sub-etchant obtained in step 1 to allow the concentration of copper ions in the obtained solution to reach the value specified in embodiments 38-39 of Table 1.

Embodiments 40-41

The procedures of embodiment 1 were repeated respectively, using the designated content of each component and parameters of the automatic detection and charging control machine as specified in embodiments 40-41 of Table 1 below. Wherein in step 1, sodium chlorate was used as the oxidant, and was prepared into a solution of 33% $NaClO_3$; and in step 2, 169.4 g of cupric chloride was added into per litre of the sub-etchant obtained in step 1 to allow the concentration of copper ions in the obtained solution to reach the value specified in embodiments 40-41 of Table 1.

Embodiment 42

The procedures of embodiment 1 were repeated respectively, using the designated content of each component and parameters of the automatic detection and charging control machine as specified in embodiment 42 of Table 1 below. Wherein in step 1, sodium chlorate was used as the oxidant, and was prepared into a solution of 5% $NaClO_3$; and in step 2, 127.1 g of cupric chloride was added into per litre of the sub-etchant obtained in step 1 to allow the concentration of copper ions in the obtained solution to reach the value specified in embodiment 42 of Table 1.

Embodiment 43

The procedures of embodiment 1 were repeated respectively, using the designated content of each component and parameters of the automatic detection and charging control machine as specified in embodiment 43 of Table 1 below. Wherein in step 1, sodium chlorate was used as the oxidant, and was prepared into a solution of 1% $NaClO_3$; and in step 2, 105.9 g of cupric chloride was added into per litre of the sub-etchant obtained in step 1 to allow the concentration of copper ions in the obtained solution to reach the value specified in embodiment 43 of Table 1.

In embodiments 42-43, the oxidant solutions used were 5% and 1% $NaClO_3$ solutions respectively. In these situations, due to excessive water present in the oxidant solution, it was difficult to maintain high concentrations of copper ions. Thus, an oxidant solution with relatively high concentration (the concentration of the sodium chlorate solution is preferably higher than 30%, and the concentration of the hydrogen peroxide solution is preferably higher than 27.5%) is preferred.

Embodiment 44

The procedures of embodiment 1 were repeated respectively, using the designated content of each component and parameters of the automatic detection and charging control machine as specified in embodiment 44 of Table 1 below. Wherein in step 1, sodium chlorate was used as the oxidant, and was prepared into a solution of 38% $NaClO_3$; and in step 2, 254.2 g of cupric chloride was added into per litre of the sub-etchant obtained in step 1 to allow the concentration of copper ions in the obtained solution to reach the value specified in embodiment 44 of Table 1.

Embodiment 45

The procedures of embodiment 1 were repeated respectively, using the designated content of each component and parameters of the automatic detection and charging control machine as specified in embodiment 45 of Table 1 below. Wherein in step 1, sodium chlorate was used as the oxidant, and was prepared into a solution of 38% $NaClO_3$; and in step 2, 381.3 g of cupric chloride was added into per litre of the sub-etchant obtained in step 1 to allow the concentration of copper ions in the obtained solution to reach the value specified in embodiment 45 of Table 1.

Embodiment 46

The procedures of embodiment 1 were repeated respectively, using the designated content of each component and parameters of the automatic detection and charging control machine as specified in embodiment 46 of Table 1 below. Wherein in step 1, hydrogen peroxide was used as the oxidant, and was prepared into a solution of 10% $H_2O_2$; and in step 2, 105.9 g of cupric chloride was added into per litre of the sub-etchant obtained in step 1 to allow the concentration of copper ions in the obtained solution to reach the value specified in embodiment 46 of Table 1.

COMPARATIVE EXAMPLE 1

Step 1: at ambient temperature and pressure, 31% by weight of HCl was dissolved in water to prepare an etchant; $NaClO_3$ was used as the oxidant, and was prepared into a solution of 30% $NaClO_3$.

Step 2: 296.5 g of cupric chloride was added into per litre of the sub-etchant obtained in step 1 to allow the concentration of copper ions in the obtained solution to arrive at the value specified in comparative example 1 of Table 1. The mass of cupric chloride added was calculated according to formula 1 in the Background section.

Step 3: the solution obtained in step 2 was poured into an etchant tank, and sensor probes of the automatic detection and charging control machine were immersed into the etchant in order to detect and control various parameters.

step 4: the oxidant solution was poured into an oxidant tank, which was connected to a charging pump controlled by an ORP numerical control meter of the automatic detection and charging control machine, hydrochloric acid was poured into a hydrochloric acid tank, which was connected to a charging pump controlled by a dissociated hydrogen ion concentration meter of the automatic detection and charging control machine; water was poured into a water tank which was connected to a charging pump controlled by a specific density numerical control meter of the automatic detection and charging control machine.

Step 5: the temperature of the etchant tank was set as 49° C., the pressure of spray nozzles of the etching machine was set as 2 kg/cm² and the concentration of dissociated hydrogen ions and the oxidation-reduction potential (ORP) was set as the values specified in Table 1. The automatic detection and charging control machine was started and the etchant was prepared; when the concentration of dissociated hydrogen ions and the ORP in the etchant arrived at the set numerical values, the numerical value of the specific density numerical control meter was set according to the reading of a hydrometer on the automatic detection and charging control machine.

Step 6: the etching operation was started. All the components in the etchant were automatically charged and balanced by the automatic detection and charging control machine, keeping the concentration of dissociated hydrogen ions, the oxidation-reduction potential and the specific density at the numerical values specified in Table 1.

An etch factor test was carried out using printed circuit board with size of 620×540 mm, copper foil thickness of 1 oz, line width and line spacing of 50.8 μm. A pure copper etching rate test board with the size of 500×300 mm×1.5 mm was employed for spray corrosion testing. The etching rate and the etch factor K were calculated using methods known in the art.

COMPARATIVE EXAMPLES 2-3

The procedures of comparative example 1 were repeated respectively, using the designated content of each component and parameters of the automatic detection and charging control machine as specified in comparative examples 2-3 of Table 1 below. Wherein in step 1, hydrogen peroxide was used as the oxidant, and was prepared into a solution of 27.5% $H_2O_2$. In step 2, 254.2 g of cupric chloride was added into per litre of the sub-etchant obtained in step 1 to allow the concentration of copper ions in the obtained solution to reach the value specified in comparative examples 2-3 of Table 1.

COMPARATIVE EXAMPLES 4-5

The procedures of comparative example 1 were repeated respectively, using the designated content of each component and parameters of the automatic detection and charging control machine as specified in comparative examples 4-5 of Table 1 below.

Wherein in step 1, hydrogen peroxide was used as the oxidant, and was prepared into a solution of 27.5% $H_2O_2$. In step 2, 169.4 g of cupric chloride was added into per litre of the sub-etchant obtained in step 1 to allow the concentration of copper ions in the obtained solution to reach the value specified in comparative examples 4-5 of Table 1.

Analysis of the data in Table 1 and table 2 shows that, the etching rates of comparative example 2 and those in embodiments 7, 25-26 and 31-37 are similar, all lying within the range of from 27.4 to 31.6 μm/min. The concentration of dissociated hydrogen ions in comparative example 2 is 2.0M, whereas those in embodiments 7, 25-26 and 31-37 are in the range of 0.2-0.5M. The etch factor of comparative example 2 is 2.0, whereas those in embodiments 7, 25-26 and 31-37 are in the range of 4.6-5.3.

The etching rate of comparative example 3 and those in embodiments 1, 4, 27 and 29-30 were similar, all in range of from 35 to 36.9 μm/min. The concentration of dissociated hydrogen ions in comparative example 3 is 3.0M, whereas those in embodiments 1, 4, 27 and 29-30 are in the range of 1.0-2.0M. The etch factor of comparative example 3 is 1.7, and those in embodiments 1, 4, 27 and 29-30 are in the range of 3.0-5.8.

The etching rate of comparative example 4 (45.6 μm/min) is similar to that of embodiment 11 (44.3 μm/min). The concentration of dissociated hydrogen ions in comparative example 4 is 4.0M, whereas that of embodiment 11 is 2.0M. The etch factor of comparative example 4 is 1.4 whereas that of embodiment 11 is 3.2.

The etching rate of comparative example 5 (60.5 μm/min) is similar to that of embodiment 22 (61.3 μm/min). The concentration of dissociated hydrogen ions in comparative example 5 is 5.0M, whereas that of embodiment 22 is 3.0M. The etch factor of comparative example 5 is 1.2, whereas that of embodiment 22 was 2.5.

In comparison with the acidic cupric chloride etchant in the prior art, the acidic cupric chloride etchant of the current invention has reduced concentration of dissociated hydrogen ions and enhanced etch factor when having the same or similar etching rates. The reduced concentration of dissociated hydrogen ions can cut down the amount of hydrochloric acid required in production process, and hence reduce production cost, and simultaneously lower irritating acidic odour produced at working temperature, ensuring the physical health of production staff. The enhanced etch factor indicates reduced etch undercut and improved etching quality. The concentration of dissociated hydrogen ions of the etchant of the invention can be as low as 0.1M, which is much lower than that of the existing acidic cupric chloride etchant. No irritating acidic odour or chlorine gas is produced at working temperature (about 50° C.). Safety of production is therefore greatly improved, the impact on the environment is reduced and the economic benefit of a producer is improved. The acidic cupric chloride etchant of the invention has the advantages of stable performance, high quality, low cost and environmental friendly, and is in full compliance with development requirements of industrial technology and national energy-saving and emission-reducing production policy.

TABLE 1

| Etching system | Parameters of automatic detection and charging control machine | | | | | Sub-etchant | | | | | | | | |
|---|---|---|---|---|---|---|---|---|---|---|---|---|---|---|
| | Concentration of dissociated hydrogen ions (M) | ORP (mV) | specific density (g/ml) | Concentration of copper ions (g/L) | Oxidant | Water (wt %) | $FeCl_3$ (wt %) | $FeCl_2$ (wt %) | Fe (wt %) | FeO (wt %) | $Fe_2O_3$ (wt %) | NaCl (wt %) | $NH_4Cl$ (wt %) | HCl (wt %) |
| comparative example 1 | 1.0 | 540 | 1.30 | 140 | 30% $NaClO_3$ | 69 | 0 | 0 | 0 | 0 | 0 | 0 | 0 | 31 |
| comparative example 2 | 2.0 | 540 | 1.27 | 120 | 27.5% $H_2O_2$ | 69 | 0 | 0 | 0 | 0 | 0 | 0 | 0 | 31 |
| comparative example 3 | 3.0 | 540 | 1.27 | 120 | 27.5% $H_2O_2$ | 69 | 0 | 0 | 0 | 0 | 0 | 0 | 0 | 31 |
| comparative example 4 | 4.0 | 540 | 1.28 | 80 | 27.5% $H_2O_2$ | 69 | 0 | 0 | 0 | 0 | 0 | 0 | 0 | 31 |
| comparative example 5 | 5.0 | 540 | 1.24 | 80 | 27.5% $H_2O_2$ | 69 | 0 | 0 | 0 | 0 | 0 | 0 | 0 | 31 |
| embodiment 1 | 1.0 | 540 | 1.29 | 120 | 27.5% $H_2O_2$ | 73 | 2 | 0 | 0 | 0 | 0 | 5 | 0 | 20 |
| embodiment 2 | 1.0 | 540 | 1.30 | 120 | 27.5% $H_2O_2$ | 71 | 4 | 0 | 0 | 0 | 0 | 5 | 0 | 20 |
| embodiment 3 | 1.0 | 540 | 1.31 | 120 | 27.5% $H_2O_2$ | 69 | 6 | 0 | 0 | 0 | 0 | 5 | 0 | 20 |
| embodiment 4 | 1.0 | 540 | 1.26 | 120 | 27.5% $H_2O_2$ | 74 | 6 | 0 | 0 | 0 | 0 | 0 | 0 | 20 |
| embodiment 5 | 2.5 | 540 | 1.28 | 120 | 50% $H_2O_2$ | 67 | 6 | 0 | 0 | 0 | 0 | 2 | 0 | 25 |
| embodiment 6 | 2.5 | 540 | 1.29 | 120 | 30% $NaClO_3$ | 67 | 6 | 0 | 0 | 0 | 0 | 2 | 0 | 25 |
| embodiment 7 | 0.5 | 560 | 1.25 | 97 | 35% $NaClO_3$ | 70.3 | 7 | 0 | 0 | 0 | 0 | 1 | 0 | 21.7 |

TABLE 1-continued

| Etching system | Parameters of automatic detection and charging control machine | | | | Oxidant | Sub-etchant | | | | | | | |
|---|---|---|---|---|---|---|---|---|---|---|---|---|---|
| | Concentration of dissociated hydrogen ions (M) | ORP (mV) | specific density (g/ml) | Concentration of copper ions (g/L) | | Water (wt %) | FeCl$_3$ (wt %) | FeCl$_2$ (wt %) | Fe (wt %) | FeO (wt %) | Fe$_2$O$_3$ (wt %) | NaCl (wt %) | NH$_4$Cl (wt %) | HCl (wt %) |
| embodiment 8 | 0.8 | 540 | 1.25 | 96 | 28% NaClO$_3$ | 72.3 | 5 | 0 | 0 | 0 | 0 | 1 | 0 | 21.7 |
| embodiment 9 | 1.0 | 540 | 1.25 | 96 | 28% NaClO$_3$ | 72.3 | 5 | 0 | 0 | 0 | 0 | 1 | 0 | 21.7 |
| embodiment 10 | 1.5 | 540 | 1.25 | 96 | 28% NaClO$_3$ | 72.3 | 5 | 0 | 0 | 0 | 0 | 1 | 0 | 21.7 |
| embodiment 11 | 2.0 | 540 | 1.25 | 85 | 20% NaClO$_3$ | 72.3 | 5 | 0 | 0 | 0 | 0 | 1 | 0 | 21.7 |
| embodiment 12 | 5.0 | 540 | 1.27 | 85 | 20% NaClO$_3$ | 61 | 7 | 0 | 0 | 0 | 0 | 1 | 0 | 31 |
| embodiment 13 | 3.0 | 540 | 1.28 | 115 | 30% NaClO$_3$ | 61 | 7 | 0 | 0 | 0 | 0 | 1 | 0 | 31 |
| embodiment 14 | 4.0 | 540 | 1.24 | 63 | 15% NaClO$_3$ | 61 | 7 | 0 | 0 | 0 | 0 | 1 | 0 | 31 |
| embodiment 15 | 0.1 | 650 | 1.46 | 15 | 30% NaClO$_3$ | 51 | 45 | 0 | 0 | 0 | 0 | 0 | 0 | 4 |
| embodiment 16 | 0.1 | 650 | 1.41 | 15 | 30% NaClO$_3$ | 58 | 38 | 0 | 0 | 0 | 0 | 0 | 0 | 4 |
| embodiment 17 | 0.1 | 600 | 1.33 | 15 | 30% NaClO$_3$ | 77 | 19 | 0 | 0 | 0 | 0 | 0 | 0 | 4 |
| embodiment 18 | 0.3 | 650 | 1.32 | 15 | 30% NaClO$_3$ | 81 | 15 | 0 | 0 | 0 | 0 | 0 | 0 | 4 |
| embodiment 19 | 0.1 | 650 | 1.17 | 1 | 30% NaClO$_3$ | 98.99 | 0.01 | 0 | 0 | 0 | 0 | 0 | 0 | 1 |
| embodiment 20 | 4.1 | 470 | 1.24 | 63 | 30% NaClO$_3$ | 68 | 6 | 0 | 0 | 0 | 0 | 1 | 0 | 25 |
| embodiment 21 | 3.0 | 380 | 1.28 | 115 | 30% NaClO$_3$ | 68 | 6 | 0 | 0 | 0 | 0 | 1 | 0 | 25 |
| embodiment 22 | 3.0 | 470 | 1.28 | 115 | 30% NaClO$_3$ | 68 | 6 | 0 | 0 | 0 | 0 | 1 | 0 | 25 |
| embodiment 23 | 0.5 | 650 | 1.25 | 92 | 38% NaClO$_3$ | 71.3 | 6 | 0 | 0 | 0 | 0 | 1 | 0 | 21.7 |
| embodiment 24 | 1.5 | 500 | 1.21 | 30 | 30% NaClO$_3$ | 72.3 | 5 | 0 | 0 | 0 | 0 | 1 | 0 | 21.7 |
| embodiment 25 | 0.2 | 540 | 1.24 | 60 | 30% NaClO$_3$ | 72.3 | 5 | 0 | 0 | 0 | 0 | 1 | 0 | 21.7 |
| embodiment 26 | 0.3 | 650 | 1.27 | 82 | 22% NaClO$_3$ | 72.3 | 5 | 0 | 0 | 0 | 0 | 1 | 0 | 21.7 |
| embodiment 27 | 0.3 | 700 | 1.32 | 70 | 30% NaClO$_3$ | 77 | 10 | 0 | 0 | 0 | 0 | 1 | 0 | 10 |
| embodiment 28 | 3.6 | 540 | 1.30 | 149 | 30% NaClO$_3$ | 62.8 | 1 | 0 | 0 | 0 | 0 | 0 | 0 | 36.5 |
| embodiment 29 | 1.4 | 540 | 1.32 | 166 | 30% NaClO$_3$ | 62.8 | 0.7 | 0 | 0 | 0 | 0 | 0 | 0 | 36.5 |
| embodiment 30 | 1.4 | 540 | 1.33 | 180 | 30% NaClO$_3$ | 62.8 | 0.7 | 0 | 0 | 0 | 0 | 0 | 0 | 36.5 |
| embodiment 31 | 0.5 | 540 | 1.25 | 100 | 25% NaClO$_3$ | 74.8 | 0 | 0 | 2.5 | 0 | 0 | 1 | 0 | 21.7 |
| embodiment 32 | 0.5 | 540 | 1.25 | 100 | 25% NaClO$_3$ | 74.2 | 0 | 0 | 0 | 3.1 | 0 | 1 | 0 | 21.7 |
| embodiment 33 | 0.5 | 540 | 1.25 | 100 | 25% NaClO$_3$ | 73.3 | 0 | 0 | 0 | 0 | 4.0 | 1 | 0 | 21.7 |
| embodiment 34 | 0.5 | 540 | 1.25 | 100 | 25% NaClO$_3$ | 74.5 | 0 | 0 | 1.5 | 1.3 | 0 | 1 | 0 | 21.7 |
| embodiment 35 | 0.5 | 540 | 1.25 | 100 | 25% NaClO$_3$ | 74.4 | 0 | 0 | 1 | 0.9 | 1 | 1 | 0 | 21.7 |
| embodiment 36 | 0.5 | 540 | 1.25 | 100 | 25% NaClO$_3$ | 74.9 | 0 | 0 | 0.5 | 0.9 | 1 | 1 | 0 | 21.7 |
| embodiment 37 | 0.5 | 540 | 1.25 | 100 | 25% NaClO$_3$ | 71.3 | 3 | 3 | 0 | 0 | 0 | 1 | 0 | 21.7 |
| embodiment 38 | 0.3 | 650 | 1.31 | 130 | 30% NaClO$_3$ | 70 | 12 | 0 | 0 | 0 | 0 | 0 | 0 | 18 |
| embodiment 39 | 0.2 | 650 | 1.31 | 130 | 30% NaClO$_3$ | 73 | 0 | 9 | 0 | 0 | 0 | 0 | 0 | 18 |
| embodiment 40 | 1.2 | 540 | 1.21 | 80 | 33% NaClO$_3$ | 78 | 2 | 0 | 0 | 0 | 0 | 0 | 8 | 12 |
| embodiment 41 | 1.2 | 540 | 1.21 | 80 | 33% NaClO$_3$ | 78 | 2 | 0 | 0 | 0 | 0 | 1 | 7 | 12 |

TABLE 1-continued

| | Parameters of automatic detection and charging control machine | | | | | Sub-etchant | | | | | | | |
|---|---|---|---|---|---|---|---|---|---|---|---|---|---|
| Etching system | Concentration of dissociated hydrogen ions (M) | ORP (mV) | specific density (g/ml) | Concentration of copper ions (g/L) | Oxidant | Water (wt %) | FeCl$_3$ (wt %) | FeCl$_2$ (wt %) | Fe (wt %) | FeO (wt %) | Fe$_2$O$_3$ (wt %) | NaCl (wt %) | NH$_4$Cl (wt %) | HCl (wt %) |
| embodiment 42 | 0.8 | 540 | 1.20 | 60 | 5% NaClO$_3$ | 82 | 3 | 0 | 0 | 0 | 0 | 0 | 0 | 15 |
| embodiment 43 | 0.8 | 540 | 1.26 | 50 | 1% NaClO$_3$ | 63 | 6 | 0 | 0 | 0 | 0 | 0 | 0 | 31 |
| embodiment 44 | 0.8 | 540 | 1.26 | 120 | 38% NaClO$_3$ | 82 | 3 | 0 | 0 | 0 | 0 | 0 | 0 | 15 |
| embodiment 45 | 0.8 | 540 | 1.28 | 180 | 38% NaClO$_3$ | 63 | 6 | 0 | 0 | 0 | 0 | 0 | 0 | 31 |
| embodiment 46 | 0.8 | 540 | 1.26 | 50 | 10% H$_2$O$_2$ | 63 | 6 | 0 | 0 | 0 | 0 | 0 | 0 | 31 |

TABLE 2

| Etching system | Etching rate (μm/min) | Etch factor K | Environmental impact |
|---|---|---|---|
| Comparative example 1 | 24.6 | 2.3 | No obvious acidic odour evolved |
| Comparative example 2 | 27.4 | 2.0 | No obvious acidic odour evolved |
| Comparative example 3 | 35 | 1.7 | Obvious acidic odour evolved |
| Comparative example 4 | 45.6 | 1.4 | Obvious acidic odour evolved |
| Comparative example 5 | 48.4 | 1.2 | Obvious acidic odour evolved |
| Embodiment 1 | 36.6 | 3.4 | No obvious acidic odour evolved |
| Embodiment 2 | 38.8 | 3.6 | No obvious acidic odour evolved |
| Embodiment 3 | 41.5 | 3.9 | No obvious acidic odour evolved |
| Embodiment 4 | 35.7 | 3.8 | No obvious acidic odour evolved |
| Embodiment 5 | 55.8 | 2.9 | Obvious acidic odour evolved |
| Embodiment 6 | 56.4 | 2.9 | Obvious acidic odour evolved |
| Embodiment 7 | 31 | 4.8 | No smell |
| Embodiment 8 | 36.3 | 4.7 | No smell |
| Embodiment 9 | 40 | 4.3 | No obvious acidic odour evolved |
| Embodiment 10 | 42.2 | 3.8 | No obvious acidic odour evolved |
| Embodiment 11 | 44.3 | 3.2 | No obvious acidic odour evolved |
| Embodiment 12 | 78.1 | 1.8 | Obvious acidic odour evolved |
| Embodiment 13 | 56.4 | 2.4 | Obvious acidic odour evolved |
| Embodiment 14 | 71.5 | 2.1 | Obvious acidic odour evolved |
| Embodiment 15 | 50.2 | 5.9 | No smell |
| Embodiment 16 | 62 | 5.7 | No smell |
| Embodiment 17 | 55.1 | 5.4 | No smell |
| Embodiment 18 | 52.4 | 5.3 | No smell |
| Embodiment 19 | 69.8 | 5.0 | No smell |
| Embodiment 20 | 60.1 | 2.1 | Obvious acidic odour evolved |
| Embodiment 21 | 47.4 | 2.4 | Obvious acidic odour evolved |
| Embodiment 22 | 54.3 | 2.5 | Obvious acidic odour evolved |
| Embodiment 23 | 37.6 | 4.7 | No smell |
| Embodiment 24 | 37.5 | 3.7 | No obvious acidic odour evolved |
| Embodiment 25 | 31.6 | 5.3 | No smell |
| Embodiment 26 | 31.3 | 5.3 | No smell |
| Embodiment 27 | 36.3 | 5.8 | No smell |
| Embodiment 28 | 50.2 | 2.2 | Obvious acidic odour evolved |
| Embodiment 29 | 36.9 | 3.1 | No obvious acidic odour evolved |
| Embodiment 30 | 36.6 | 3.0 | No obvious acidic odour evolved |
| Embodiment 31 | 31 | 4.7 | No smell |
| Embodiment 32 | 31.3 | 4.9 | No smell |
| Embodiment 33 | 31 | 4.8 | No smell |
| Embodiment 34 | 30.4 | 4.6 | No smell |
| Embodiment 35 | 31.6 | 4.7 | No smell |
| Embodiment 36 | 31.6 | 4.7 | No smell |
| Embodiment 37 | 31.6 | 4.7 | No smell |
| Embodiment 38 | 36.3 | 5.9 | No smell |
| Embodiment 39 | 36.2 | 5.8 | No smell |
| Embodiment 40 | 35.9 | 4.0 | No obvious acidic odour evolved |
| Embodiment 41 | 36.0 | 4.1 | No obvious acidic odour evolved |
| Embodiment 42 | 39.0 | 4.8 | No smell |
| Embodiment 43 | 38.9 | 4.7 | No smell |
| Embodiment 44 | 38.8 | 4.9 | No smell |
| Embodiment 45 | 38.9 | 4.7 | No smell |
| Embodiment 46 | 39.0 | 4.7 | No smell |

What is claimed is:

1. A high-efficiency and high-quality acidic cupric chloride etchant for printed circuit board, comprising cupric chloride, a sub-etchant and an oxidant, wherein an automatic detection and charging control machine is used for detecting the concentration of dissociated hydrogen ions, oxidation-reduction potential and specific density parameters in the etchant and controlling the charging amount of each component so as to enable the concentration of copper ions, the concentration of dissociated hydrogen ions and the oxidation-reduction potential in the solution to arrive at set numerical values, and the high-efficiency and high-quality acidic cupric chloride etchant for printed circuit board is characterised in that the sub-etchant comprises the following components in percentage by weight:

1%-36.5% of HCl;
0.01%-45% of one or more compounds selected from FeCl$_3$, FeCl$_2$, Fe, FeO and Fe$_2$O$_3$; and
the balance of water,
the control parameters of a production process of the obtained etchant are set as follows: the concentration of dissociated hydrogen ions is 0.1-5.0M, the oxidation-reduction potential is 380-700 mV and the concentration of copper ions is 1-180 g/L; the initial charging amount B of cupric chloride is obtained by calculation according to the following formula:

$$B=(134.5/63.5)\times\text{set value } A \text{ of concentration of copper ions.}$$

2. The high-efficiency and high-quality acidic cupric chloride etchant for printed circuit board according to claim 1, characterised in that the sub-etchant comprises the following components in percentage by weight:
4%-36.5% of HCl;
0.7%-19% of one or more compounds selected from FeCl$_3$, FeCl$_2$, Fe, FeO and Fe$_2$O$_3$; and
the balance of water.

3. The high-efficiency and high-quality acidic cupric chloride etchant for printed circuit board according to claim 2, characterised in that the sub-etchant comprises the following components in percentage by weight:
10%-31% of HCl; 1%-15% of one or more compounds selected from FeCl$_3$, FeCl$_2$, Fe, Fe FeO and Fe$_2$O$_3$, and the balance of water.

4. The high-efficiency and high-quality acidic cupric chloride etchant for printed circuit board according to claim 1, characterised in that the concentration of dissociated hydrogen ions is 0.2-4.0M, the oxidation-reduction potential is 470-700 mV and the concentration of copper ions is 60-166 g/L.

5. The high-efficiency and high-quality acidic cupric chloride etchant for printed circuit board according to claim 4, characterised in that the concentration of dissociated hydrogen ions is from 0.2M to leas than 2.0M, the oxidation-reduction potential is 500-650 mV and the concentration of copper ions is 70-149 g/L.

6. The high-efficiency and high-quality acidic cupric chloride etchant for printed circuit board according to claim 4, characterised in that the concentration of dissociated hydrogen ions is 2-2.5M, the oxidation-reduction potential is 500-650 mV and the concentration of copper ions is 70-149 g/L.

7. The high-efficiency and high-quality acidic cupric chloride etchant for printed circuit board according to claim 5, characterised in that after cupric chloride at an amount of not less than 1 g/L is pre-added, then copper is selected and used instead of cupric chloride and added into the sub-etchant, and the initial amount C of copper used instead of cupric chloride and added into the sub-etchant =(set value of the concentration of copper ions A)-( (pre-charging amount of cupric chloride B')×63.5÷134.5) g/L.

8. The high-efficiency and high-quality acidic cupric chloride etchant for printed circuit board according to claim 6, characterised in that after cupric chloride at an amount of not less than 1 g/L is pre-added, then copper is selected instead of cupric chloride and added into the sub-etchant, and the initial amount C of copper used instead of cupric chloride and added into the sub-etchant =(set value of the concentration of copper ions A)-((pre-charging amount of cupric chloride B')×63.5÷134.5) g/L.

9. The high-efficiency and high-quality acidic cupric chloride etchant for printed circuit board according to claim 7, characterised in that the used oxidant is selected as H$_2$O$_2$ with the concentration of 5%-50% or NaClO$_3$ with the concentration of 1%-38%.

10. The high-efficiency and high-quality acidic cupric chloride etchant for printed circuit board according to claim 8, characterised in that the used oxidant is selected as H$_2$O$_2$ with the concentration of 5%-50% or NaClO$_3$ with the concentration of 1%-38%.

11. The high-efficiency and high-quality acidic cupric chloride etchant for printed circuit board according to claim 2, characterised in that the concentration of dissociated hydrogen ions is 0.2-4.0M, the oxidation-reduction potential is 470-700 mV and the concentration of copper ions is 60-166 g/L.

12. The high-efficiency and high-quality acidic cupric chloride etchant for printed circuit board according to claim 3, characterised in that the concentration of dissociated hydrogen ions is 0.2-4.0M, the oxidation-reduction potential is 470-700 mV and the concentration of copper ions is 60-166 g/L.

13. The high-efficiency and high-quality acidic cupric chloride etchant for printed circuit board according to claim 11, characterised in that the concentration of dissociated hydrogen ions is from 0.2M to leas than 2.0M, the oxidation-reduction potential is 500-650 mV and the concentration of copper ions is 70-149 g/L.

14. The high-efficiency and high-quality acidic cupric chloride etchant for printed circuit board according to claim 12, characterised in that the concentration of dissociated hydrogen ions is from 0.2M to leas than 2.0M, the oxidation-reduction potential is 500-650 mV and the concentration of copper ions is 70-149 g/L.

15. The high-efficiency and high-quality acidic cupric chloride etchant for printed circuit board according to claim 11, characterised in that the concentration of dissociated hydrogen ions is 2-2.5M, the oxidation-reduction potential is 500-650 mV and the concentration of copper ions is 70-149 g/L.

16. The high-efficiency and high-quality acidic cupric chloride etchant for printed circuit board according to claim 12, characterised in that the concentration of dissociated hydrogen ions is 2-2.5M, the oxidation-reduction potential is 500-650 mV and the concentration of copper ions is 70-149 g/L.

17. The high-efficiency and high-quality acidic cupric chloride etchant for printed circuit board according to claim 13, characterised in that after cupric chloride at an amount of not less than 1 g/L is pre-added, then copper is selected and used instead of cupric chloride and added into the sub-etchant, and the initial amount C of copper used instead of cupric chloride and added into the sub-etchant =(set value of the concentration of copper ions A)-( (pre-charging amount of cupric chloride B')×63.5÷134.5) g/L.

18. The high-efficiency and high-quality acidic cupric chloride etchant for printed circuit board according to claim 14, characterised in that after cupric chloride at an amount of not less than 1 g/L is pre-added, then copper is selected and used instead of cupric chloride and added into the sub-etchant, and the initial amount C of copper used instead of cupric chloride and added into the sub-etchant =(set value of the concentration of copper ions A)-( (pre-charging amount of cupric chloride B')×63.5÷134.5) g/L.

19. The high-efficiency and high-quality acidic cupric chloride etchant for printed circuit board according to claim 1, wherein the sub-etchant further comprises 1%-8% by weight of an etchant additive.

20. The high-efficiency and high-quality acidic cupric chloride etchant for printed circuit board according to claim 19, wherein the etchant additive is NaCl and/or $NH_4Cl$.

\* \* \* \* \*